United States Patent
Inuzuka et al.

(10) Patent No.: US 6,973,000 B2
(45) Date of Patent: Dec. 6, 2005

(54) SYNCHRONOUS SEMICONDUCTOR MEMORY DEVICE OF FAST RANDOM CYCLE SYSTEM AND TEST METHOD THEREOF

(75) Inventors: Kazuko Inuzuka, Yokohama (JP); Kazuaki Kawaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 10/662,780

(22) Filed: Sep. 15, 2003

(65) Prior Publication Data

US 2004/0062090 A1 Apr. 1, 2004

(30) Foreign Application Priority Data

Sep. 30, 2002 (JP) .............................. 2002-287868

(51) Int. Cl.$^7$ .............................................. G11C 7/00
(52) U.S. Cl. ................. 365/191; 365/189.08; 365/194; 365/201; 365/233
(58) Field of Search .......................... 365/189.08, 191, 365/201, 233, 194

(56) References Cited

U.S. PATENT DOCUMENTS

| | | | |
|---|---|---|---|
| 6,426,915 B2 | 7/2002 | Ohshima et al. | |
| 6,563,760 B2 * | 5/2003 | Song | ........................... 365/233 |
| 6,882,586 B2 * | 4/2005 | Sato et al. | .................. 365/201 |

* cited by examiner

Primary Examiner—Hoai Ho
Assistant Examiner—Ly Duy Pham
(74) Attorney, Agent, or Firm—Hogan & Hartson, LLP

(57) ABSTRACT

An FCRAM includes first to third circuits. The first circuit generates a first signal based on a command detection signal. The second circuit is configured to receive the command detection signal, an operation mode specifying signal and a selection signal and generate a second signal which causes the start timing of the operation of a row-system circuit to be synchronized with the input timing of a second command. The third circuit is configured to select the first signal when a normal operation mode is specified by the operation mode specifying signal, select the second signal when a test mode is specified, and generate a third signal used to activate at least part of the memory cells in a memory cell array based on a selected one of the first and second signals and the selection signal.

7 Claims, 5 Drawing Sheets

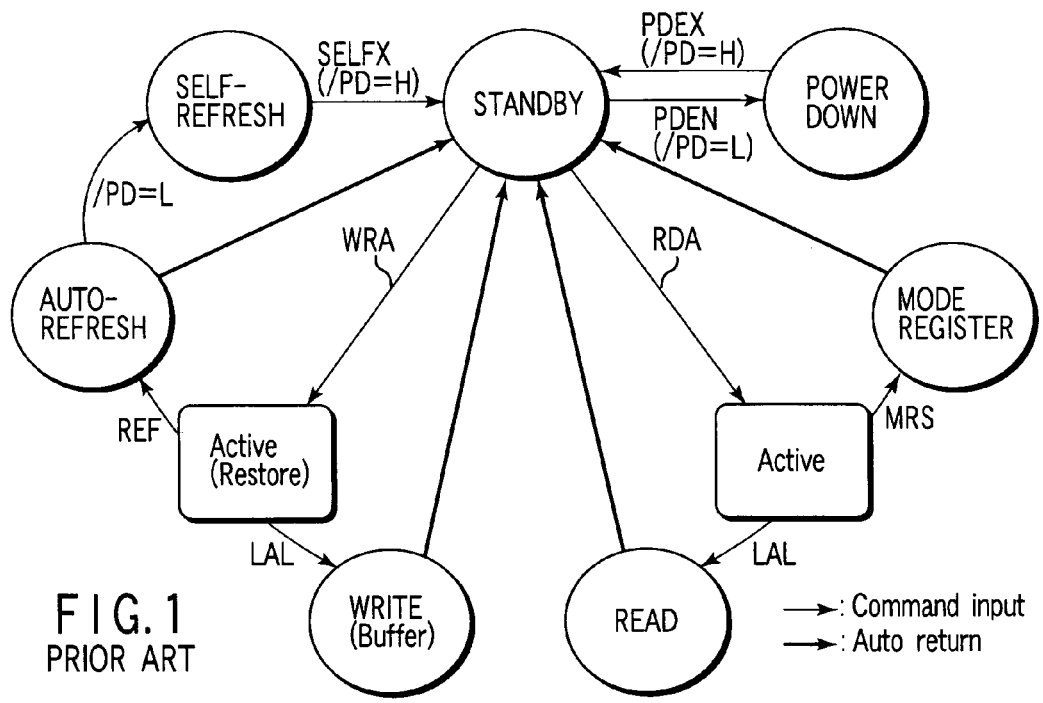

FIG. 1 PRIOR ART

1st Command

| Function | Symbol | Pin name | | | | | |
|---|---|---|---|---|---|---|---|
| | | /CS | FN (/RAS) | A14 (/WE) | A13 (/CAS) | BA1-0 | A12-0 |
| Deselect | DESL | H | X | X | X | X | X |
| Read with Auto-close | RDA | L | H | UA | UA | BA | UA |
| Write with Auto-close | WRA | L | L | UA | UA | BA | UA |

FIG. 2A PRIOR ART

2nd Command (1clock after from RDA or WRA command)

| Function | Symbol | Pin name | | | | | |
|---|---|---|---|---|---|---|---|
| | | /CS | FN (/RAS) | A14 (/WE) | A13 (/CAS) | BA1-0 | A12-0 |
| Lower Address Latch | LAL | H | X | X | X | X | LA |
| Mode Register Set* | MRS | L | X | L | L | V | V |
| Auto-Refresh | REF | L | X | X | X | X | X |

Note* BA0=L select Standard Mode Register and
BA0=H does Extended Mode Register

FIG. 2B PRIOR ART

SYNCHRONOUS SEMICONDUCTOR MEMORY DEVICE OF FAST RANDOM CYCLE SYSTEM AND TEST METHOD THEREOF

CROSS-REFERENCE TO RELATED APPLICATIONS

This application is based upon and claims the benefit of priority from the prior Japanese Patent Application No. 2002-287868, filed Sep. 30, 2002, the entire contents of which are incorporated herein by reference.

BACKGROUND OF THE INVENTION

1. Field of the Invention

This invention relates to a synchronous semiconductor memory device and more particularly to a synchronous semiconductor memory device of fast random cycle system (FCRAM) having a function of performing reading/writing of random data with respect to a memory cell array at high speed and a test method thereof, and is used in a fast random cycle RAM (SDR-FCRAM) and a double data rate type fast random cycle RAM (DDR-FCRAM) having a data transfer rate which is twice that of the above RAM, for example.

2. Description of the Related Art

In order to enhance the data access speed of the DRAM and attain large data bandwidth, a synchronous DRAM (SDRAM) is proposed and put into practical use. Recently, in order to further increase the bandwidth, a double data rate SDRAM (DDR-SDRAM) operated at a data rate which is twice that of the SDRAM is proposed and commercialized. Thus, the bandwidth of the SDRAM is increased However, it is difficult to significantly reduce the random cycle time (tRC), that is, the cycle time of data access to a different row address since a certain time is required for the operation of data readout from the memory core, amplification operation and precharge operation.

In order to solve the above problem, a fast cycle RAM (FCRAM) in which access to the memory core and the precharge operation are pipelined to reduce the random cycle time tRC to half that of the conventional SDRAM or less is proposed and starts to be commercialized. The fast cycle RAM is described in U.S. Pat. No. 6,426,915, for example.

First, the command system of the FCRAM is schematically explained. The command of the FCRAM includes a first command and a second command input in a cycle next to a cycle of the first command and various operations are determined based on the combination of the commands. The first command is a command used to start the operation of the row-system circuit and the second command is a command used to start the operation of the column-system circuit. Time tRCD from the time the first command is input to start the operation of the row-system circuit until the second command is input to start the operation of the column-system circuit is set as one clock cycle.

FIG. 1 is a diagram showing transition of operation states caused by the combination of the first and second commands of the FCRAM. FIGS. 2A and 2B are function tables showing pin inputs corresponding to command inputs of FIG. 1.

As shown in FIG. 1, in response to first command input next to the standby state (STANDBY), a row address is fetched and a read command (Read with Auto-close) RDA or write command (Write with Auto-close) WRA is directly given instead of the conventional row access command ACT which starts the operation of the peripheral row-system circuit. Then, as shown in the function tables of FIGS. 2A and 2B, a command input is received when a chip select signal /CS pin provided in the SDR/DDR-SDRAM is set to the "L" level. The read command and write command are distinguished according to the level of a signal supplied to an FN (function control) pin, which defines the type of a command. In this example, the FN pin is set to the "H" level at the read time and it is set to the "L" level at the write time.

Further, a division decoding row address of the sense amplifier can be given by use of the first command. However, since the number of pins of a standard package used in the SDR/DDR-SDRAM is limited, existing control pins are used as address pins to suppress an increase in the number of pins. In this example, a /WE (write enable) signal pin and /CAS (column address strobe) signal pin in the SDR/DDR-SDRAM are used as address pins A14, A13.

The command is determined based on the combination of the two pins of /CS (chip select signal) and FN (function control signal). The first command includes a write active (Write with Auto-Close: WRA) command in which /CS="L" level and FN="H" level and a read active (Read with Auto-Close: RDA) command in which /CS= "L" level and FN="L" level. The second command includes a lower address latch (LAL) command of /CS= "H" level and a mode register set (MRS) command and auto refresh (REF) command of /CS="L" level. By the combination of the above commands, commands for a write operation, read operation, mode register set operation and auto refresh operation are input. Further, the row address and column address are fetched at the first command input time and second command input time, respectively.

In the FCRAM with the above configuration, since the write/read operation is determined by the first command, not only the operation of the peripheral circuit but also the operation of the memory core can be started at the same time as fetching of the row address. In this case, random access can be started earlier than in a case wherein the operation of the memory core is started based on the second command. Further, since it is sufficient only if the column address is fetched by use of the second command, the process of selecting a column selection line CSL and outputting data can be rapidly performed. Thus, data can be transferred to the peripheral portion early. Therefore, the precharge operation of a bit line can be performed earlier (the precharge timing can be advanced) after a word line is reset. That is, in the FCRAM, both of the random access time tRAC and random cycle time tRC can be reduced.

Next, the operation of the FCRAM is simply explained.

FIG. 3 is an operation waveform diagram for illustrating the operation of the FCRAM when the clock cycle time is short. In the FCRAM, the first and second commands are input in successive cycles. When a signal (command detection signal) bACTV used to start the operation of the row-system circuit is set to the "L" level in response to the first command, an activation signal BNK of a corresponding bank is set to the "H" level, a word line WL of a corresponding address is activated and cell data is read out to a bit line pair BL. As a result, a signal (column gating releasing signal) bCENB which permits the operation of the column-system circuit to be started is set to the "L" level.

On the other hand, the write/read operation and auto refresh/mode register set are detected in response to input of the second command. A second command detection signal bCOLACT is set at the "L" level to start the operation of the column-system circuit at the read/write time. In response to a signal CENBON which is generated by accepting the read/write operation when the second command is input, a column select signal is generated (the column selection line CSL is set to the "H" level). Further, in a corresponding column address, data on the bit line BL is read out at the read time and data is written onto the bit line BL at the write time.

The bank activation time is set by use of an internal timer and a signal FCTMR which terminates the bank activation operation is output in response to the "L" level of an output signal BNKTMR of the timer which is operated in response to an activation signal BNK of a corresponding bank. Then, when a preset period of time has elapsed after the activation operation was started, the activation signal BNK of the corresponding bank becomes deactivated and the row precharge operation is started.

When the clock cycle time is short, the column selection line CSL does not instantly accept switching of the second command detection signal bCOLACT to the "L" level and is switched to the "H" level after the "L" level of the column gating release signal bCENB of the row-system circuit is accepted. At this time, a series of operations of switching from the row system to the column system is performed and the severest condition is put on the time tRCD from the time the first command is input to start the operation of the row-system circuit until the second command is input to start the operation of the column-system circuit.

In the memory which performs the high-speed operation, the specification of the time tRCD is severe. In the upstream step, that is, in the die sort test in which the basic operation of the product is checked, it is important to screen and replace a bit having a small amount of readout signal from the memory cell by a redundancy bit and enhance the yield in the later step. In the die sort test, a clock of a cycle longer than the period of the normal operation is input, but in the synchronous DRAM, the screening operation is performed by inputting the second command in the time tRCD which is shorter than the time defined by the specification.

However, in the FCRAM, the time tRCD from the time the first command is input until the second command is accepted is defined by one clock cycle and, in the die sort test in which the clock cycle is longer, the test cannot be made by reducing the time tRCD and it is difficult to perform the screening operation.

FIG. 4 is an operation waveform diagram for illustrating the operation of the FCRAM when the condition of the clock cycle time in the die sort test or the like is alleviated. As is clearly understood from FIG. 4, since the condition of tRCD is alleviated, the column selection line CSL is instantly switched to the "H" level in response to the second command detection signal bCOLACT without waiting for the "L" level of the column gating release signal bCENB which makes a column control circuit operable after the operation of the row-system circuit is terminated.

That is, since the column selection line CSL is selected under a condition that the bit line BL/bBL is charged/discharged to a VBLH/VSS level to some extent, a test is made in a condition which is alleviated in comparison with the actual operation and there occurs a possibility that faulty products will be overlooked in the test.

As described above, in the conventional synchronous semiconductor memory device of fast random cycle system and the test method thereof, the clock signal having a long cycle which exceeds time specified by the normal specification is input when an entry is made into the test mode such as the die sort test in which the clock cycle time tCK is long. Therefore, it is difficult to make the screening test while the time tRCD from the time the first command is input to start the operation of the row-system circuit until the second command is input to start the operation of the column-system circuit is reduced.

BRIEF SUMMARY OF THE INVENTION

According to one aspect of this invention, a synchronous semiconductor memory device in which an operation of a row-system circuit is started in response to input of a first command and an operation of a column-system circuit is started in response to input of a second command, comprises a first circuit configured to generate a first signal for a normal operation mode based on a command detection signal which is activated in response to the first command, a second circuit configured to receive the command detection signal, an operation mode specifying signal which selectively specifies one of the normal operation mode and test mode and a selection signal used to select at least part of the memory cells in a memory cell array and generate a second signal for a test mode to synchronize start timing of the operation of the row-system circuit with input timing of the second command, and a third circuit configured to select the first signal output from the first circuit when the normal operation mode is specified by the operation mode specifying signal, select the second signal output from the second circuit when the test mode is specified, and generate a third signal used to activate at least part of the memory cells in the memory cell array based on a selected one of the first and second signals and the selection signal.

According to another aspect of this invention, a synchronous semiconductor memory device in which an operation of a row-system circuit is started in response to input of a first command and an operation of a column-system circuit is started in response to input of a second command, comprises a first circuit configured to generate a first signal for a normal operation mode based on a command detection signal which is activated in response to the first command, a second circuit configured to receive the command detection signal, an operation mode specifying signal which selectively specifies one of the normal operation mode and test mode and a selection signal used to select at least part of the memory cells in a memory cell array and generate a second signal for a test mode to synchronize start timing of the operation of the row-system circuit with clock cycle time in which a column selection line is activated, and a third circuit configured to select the first signal output from the first circuit when the normal operation mode is specified by the operation mode specifying signal, select the second signal output from the second circuit when the test mode is specified, and generate a third signal used to activate at least part of the memory cells in the memory cell array based on a selected one of the first and second signals and the selection signal.

Further, according to still another aspect of this invention, a synchronous semiconductor memory device in which an operation of a row-system circuit is started in response to input of a first command and an operation of a column-system circuit is started in response to input of a second command, comprises a first circuit configured to generate a first signal for a normal operation mode based on a command detection signal which is activated in response to the first command, a second circuit configured to receive the command detection signal, an operation mode specifying signal which selectively specifies one of the normal operation mode and test mode and a selection signal used to select at least part of the memory cells in a memory cell array and generate a second signal for a test mode to set start timing of the operation of the row-system circuit by sequentially delaying start timing of the operation of the row-system circuit with respect to the second command in a half-clock unit or one clock unit and selecting a delay amount based n a timing control signal, and a third circuit configured to select the first signal output from the first circuit when the normal operation mode is specified by the operation mode specifying signal, select the second signal output from the second circuit when the test mode is specified, and generate a third signal used to activate at least part of the memory cells in the memory cell array based on a selected one of the first and second signals and the selection signal.

According to another aspect of this invention, a method for testing a synchronous semiconductor memory device in which an operation of a row-system circuit is started in response to input of a first command and an operation of a column-system circuit is started in response to input of a second command, comprises inputting an operation mode specifying signal which selectively specifies one of a normal operation mode and test mode, inputting a first command, inputting a second command in a cycle next to a cycle in which the first command is input, synchronizing start timing of the operation of the row-system circuit with input timing of the second command when the test mode is specified by the operation mode specifying signal, activating at least part of the memory cells in a memory cell array, and making a screening test with respect to the activated memory cell.

According to still another aspect of this invention, a method for testing a synchronous semiconductor memory device in which an operation of a row-system circuit is started in response to input of a first command and an operation of a column-system circuit is started in response to input of a second command, comprises inputting an operation mode specifying signal which selectively specifies one of a normal operation mode and test mode, inputting a first command, inputting a second command in a cycle next to a cycle in which the first command is input, synchronizing start timing of the operation of the row-system circuit with clock cycle time in which a column selection line is activated when the test mode is specified by the operation mode specifying signal, activating at least part of the memory cells in a memory cell array, and making a screening test with respect to the activated memory cell.

According to another aspect of this invention, a method for testing a synchronous semiconductor memory device in which an operation of a row-system circuit is started in response to input of a first command and an operation of a column-system circuit is started in response to input of a second command, comprises inputting an operation mode specifying signal which selectively specifies one of a normal operation mode and test mode, inputting a first command, inputting a second command in a cycle next to a cycle in which the first command is input, delaying start timing of the operation of the row-system circuit with respect to the second command in a half-clock unit or one clock unit when the test mode is specified by the operation mode specifying signal, selecting start timing of the operation of the row-system circuit based on a timing control signal, activating at least part of the memory cells in a memory cell array, and making a screening test with respect to the activated memory cell.

BRIEF DESCRIPTION OF THE SEVERAL VIEWS OF THE DRAWING

FIG. 1 is a diagram showing transition of states caused by a combination of first and second commands of an FCRAM, for illustrating the conventional synchronous semiconductor memory device;

FIG. 2A is a diagram showing a function table for illustrating pin input (first command) corresponding to command input of FIG. 1, for illustrating the conventional synchronous semiconductor memory device;

FIG. 2B is a diagram showing a function table for illustrating pin input (second command) corresponding to command input of FIG. 1, for illustrating the conventional synchronous semiconductor memory device;

FIG. 8 is an operation waveform diagram obtained in a case wherein a screening test of tRCD having a guard band is made, for illustrating a synchronous semiconductor memory device according to a third embodiment of this invention and a test method thereof.

DETAILED DESCRIPTION OF THE INVENTION

[First Embodiment]

In a first embodiment, when an entry is made into a test mode such as a die sort test in which clock cycle time tCK is long in an FCRAM, start timing of the operation of a row-system circuit in the FCRAM is delayed and a screening test is made. For example, by delaying a bank activation signal bBNKACT until a second command is input, time tRCD from the time the first command is input to start the operation of the row-system circuit until the second command is input to start the operation of the column-system circuit is reduced and a screening test for the memory core is made.

Figure 3:
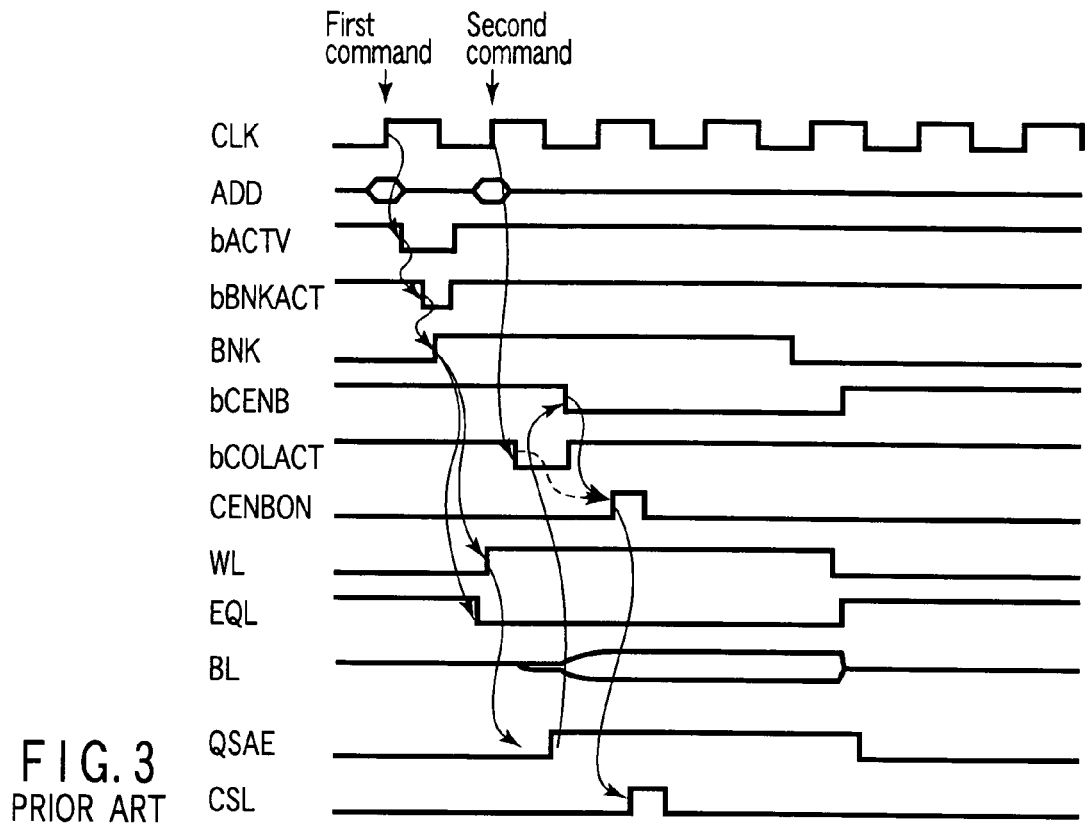
FIG. 3 is an operation waveform diagram for illustrating the operation of an FCRAM at a fast clock frequency.
Figure 4:
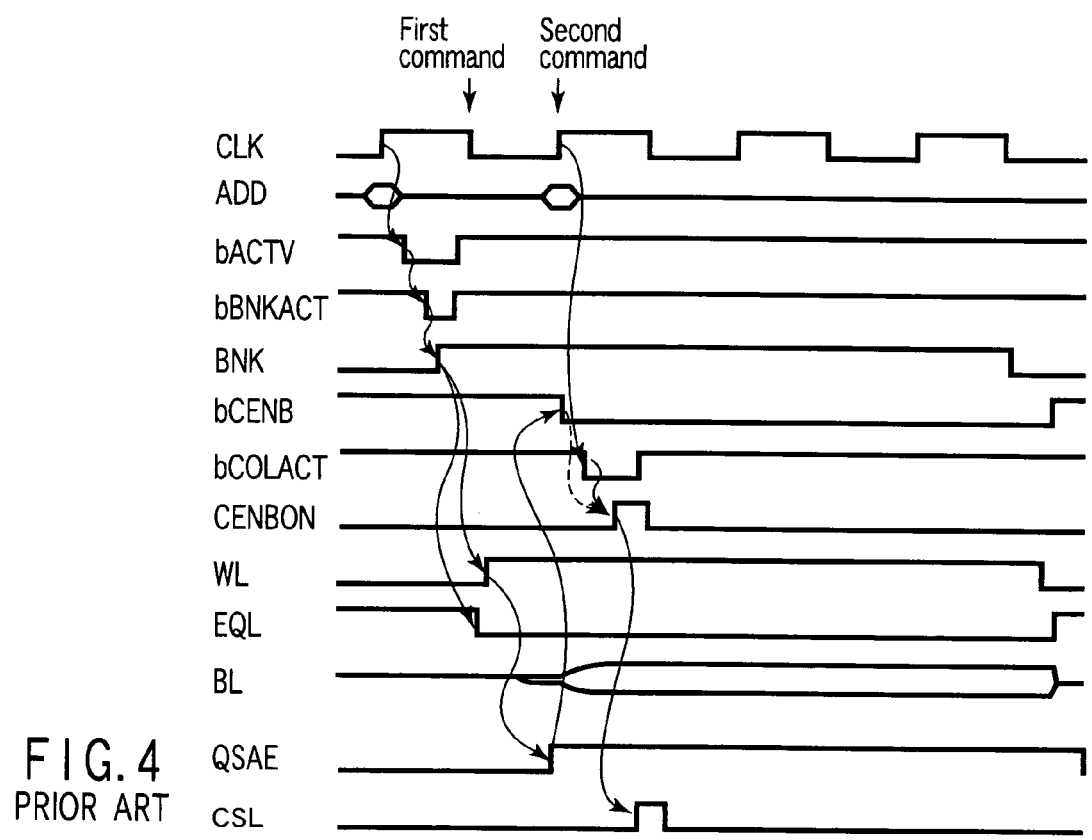
FIG. 4 is an operation waveform diagram for illustrating the operation of an FCRAM in an alleviated condition of the clock frequency.
Figure 5:
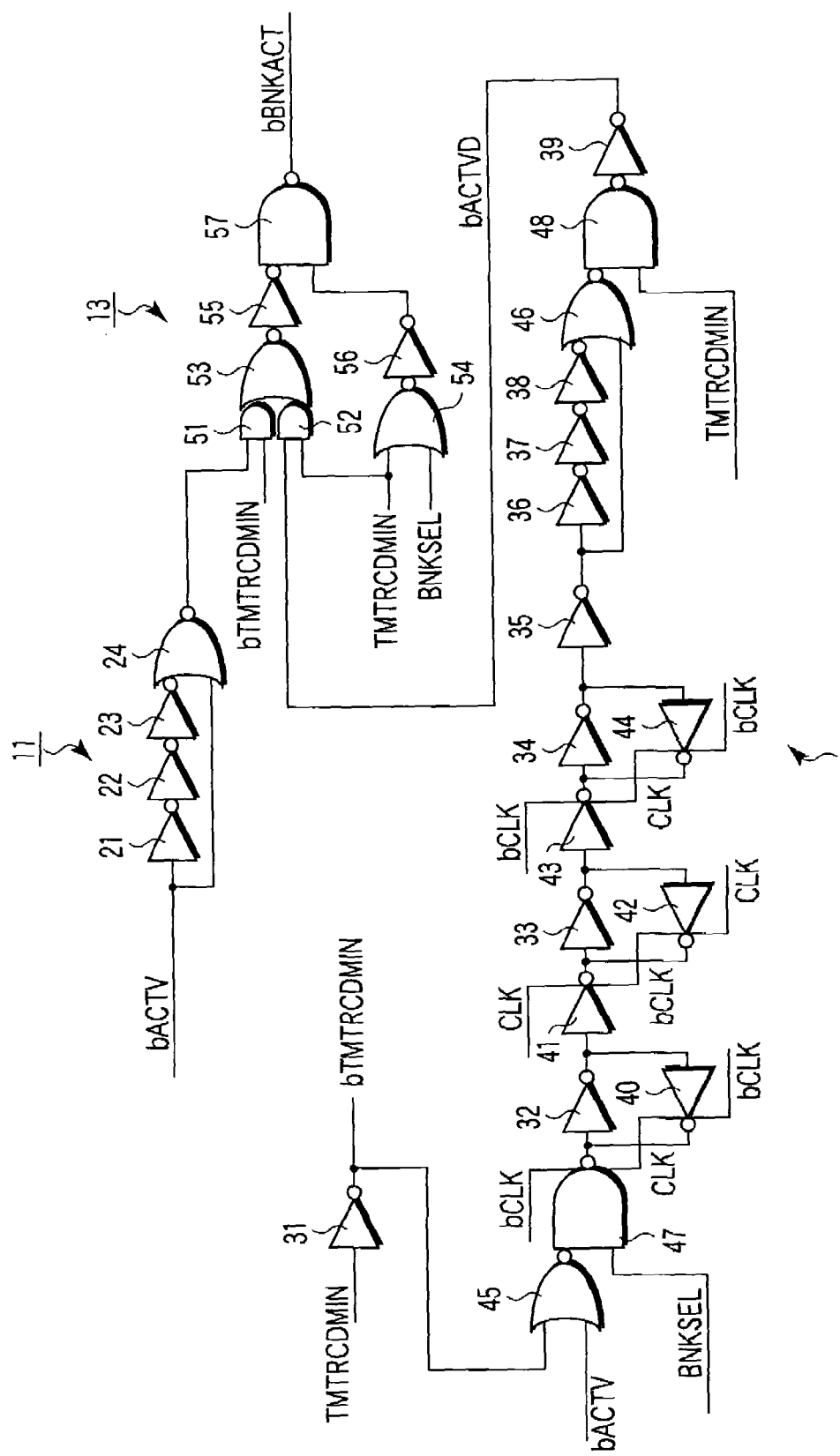
FIG. 5 is a circuit diagram showing an example of the configuration of an extracted circuit used to realize a die sort test in which tRCD is severely limited in an alleviated condition of the clock frequency, for illustrating a synchronous semiconductor memory device according to a first embodiment of this invention.

FIG. 5 shows an example of the configuration of an extracted circuit to make a screening test in the operation (tRCDmin) of the FCRAM in which tRCD is shortened in a die sort test in which the clock cycle time tCK is long, for illustrating a synchronous semiconductor memory device according to the first embodiment of this invention. The circuit generates a bank activation signal bBNKACT at different timings in the normal operation mode and in the test mode based on a command detection signal bACTV, operation mode specifying signals TMTRCDMIN, bTMTRCDMIN which specify the normal operation mode and test mode and bank selection signal BNKSEL and activates a bank selected in the memory cell array.

As shown in FIG. 5, the circuit includes first to third circuits 11 to 13 configuring logical circuits which generate signals of desired timings. The first circuit 11 generates a signal for the normal operation mode based on the command detection signal bACTV which is activated in response to the first command. The second circuit 12 receives the command detection signal bACTV, operation mode specifying signal TMTRCDMIN and bank selection signal BNKSEL used to select a bank and generates a second signal bACTVD for the test mode used to set (synchronize) start timing of the operation of the row-system circuit at the same timing as input timing of the second command. The third circuit 13 performs the switching operation between the normal operation mode and test mode in response to the operation mode specifying signals TMTRCDMIN, bTMTRCDMIN. In each case of the normal operation mode and test mode, the command detection signal bACTV is activated for all of the banks, and when the normal operation mode is specified, a third signal bBNKACT is output only from a bank which is selected by the bank selection signal BNKSEL. On the other hand, when the test mode is specified, the second signal bACTVD is selected only in the bank which is selected by the bank selection signal BNKSEL and a third signal bBNKACT is output.

The first circuit 11 is a pulse generation circuit which generates a pulse signal with a preset period based on a signal (command detection signal) bACTV used to start the operation of the row-system circuit and includes inverters 21, 22, 23 and NOR gate 24. The command detection signal bACTV is supplied to the input terminal of the inverter 21 and one input terminal of the NOR gate 24. The output terminal of the inverter 21 is connected to the input terminal of the inverter 22 whose output terminal is connected to the input terminal of the inverter 23. The output terminal of the inverter 23 is connected to the other input terminal of the NOR gate 24 and the first signal is output from the output terminal of the NOR gate 24.

The second circuit 12 includes inverters 31 to 39, clocked inverters 40 to 44, NOR gates 45, 46 and NAND gates 47, 48. The operation mode specifying signal TMTRCDMIN is supplied to the input terminal of the inverter 31 and an output signal bTMTRCDMIN of the inverter 31 is supplied to one input terminal of the NOR gate 45. The command detection signal bACTV is supplied to the other input terminal of the NOR gate 45. The output terminal of the NOR gate 45 is connected to one input terminal of the NAND gate 47. The NAND gate 47 is operated in synchronism with clock signals bCLK, CLK and the bank selection signal BNKSEL is supplied to the other input terminal thereof. The output terminal of the NAND gate 47 is connected to the input terminal of the inverter 32. The output terminal of the inverter 32 is connected to the input terminal of the clocked inverter 40 which is operated in synchronism with the clock signals CLK, bCLK and the output terminal thereof is connected to the input terminal of the inverter 32. Further, the output terminal of the inverter 32 is connected to the input terminal of the clocked inverter 41 which is operated in synchronism with the clock signals CLK, bCLK. The output terminal of the clocked inverter 41 is connected to the input terminal of the inverter 33. The output terminal of the inverter 33 is connected to the input terminal of the clocked inverter 42 which is operated in synchronism with the clock signals bCLK, CLK and the output terminal thereof is connected to the input terminal of the inverter 33. The output terminal of the inverter 33 is connected to the input terminal of the clocked inverter 43 which is operated in synchronism with the clock signals bCLK, CLK. The output terminal of the clocked inverter 43 is connected to the input terminal of the inverter 34. The output terminal of the inverter 34 is connected to the input terminal of the clocked inverter 44 which is operated in synchronism with the clock signals CLK, bCLK and the output terminal thereof is connected to the input terminal of the inverter 34.

Further, the output terminal of the inverter 34 is connected to the input terminal of the inverter 35. The output terminal of the inverter 35 is connected to the input terminal of the inverter 36 and one input terminal of the NOR gate 46. The output terminal of the inverter 36 is connected to the input terminal of the inverter 37, the output terminal of the inverter 37 is connected to the input terminal of the inverter 38, and the output terminal of the inverter 38 is connected to the other input terminal of the NOR gate 46. The output terminal of the NOR gate 46 is connected to one input terminal of the NAND gate 48 and the signal TMTRCDMIN is supplied to the other input terminal thereof. The output terminal of the NAND gate 48 is connected to the input terminal of the inverter 39 and the command detection signal (second signal) bACTVD for the test is output from the inverter 39.

The third circuit 13 includes AND gates 51, 52, NOR gates 53, 54, inverters 55, 56 and NAND gate 57. The output terminal of the NOR gate 24 is connected to one input terminal of the AND gate 51 and a signal bTMTRCDMIN output from the inverter 31 is supplied to the other input terminal thereof. The output terminal of the inverter 39 is connected to one input terminal of the AND gate 52 and a signal bACTVD is supplied thereto and a signal TMTRCDMIN is supplied to the other input terminal thereof. The output terminals of the AND gates 51, 52 are respectively connected to two input terminals of the NOR gate 53. The output terminal of the NOR gate 53 is connected to the input terminal of the inverter 55. The signal TMTRCDMIN and bank selection signal BNKSEL are respectively supplied to two input terminals of the NOR gate 54 and the output terminal of the NOR gate 54 is connected to the input terminal of the inverter 56. The output terminals of the inverters 55, 56 are respectively connected to two input terminals of the NAND gate 57 and a bank activation signal (third signal) bBNKACT is output from the output terminal of the NAND gate 57.

Figure 6:
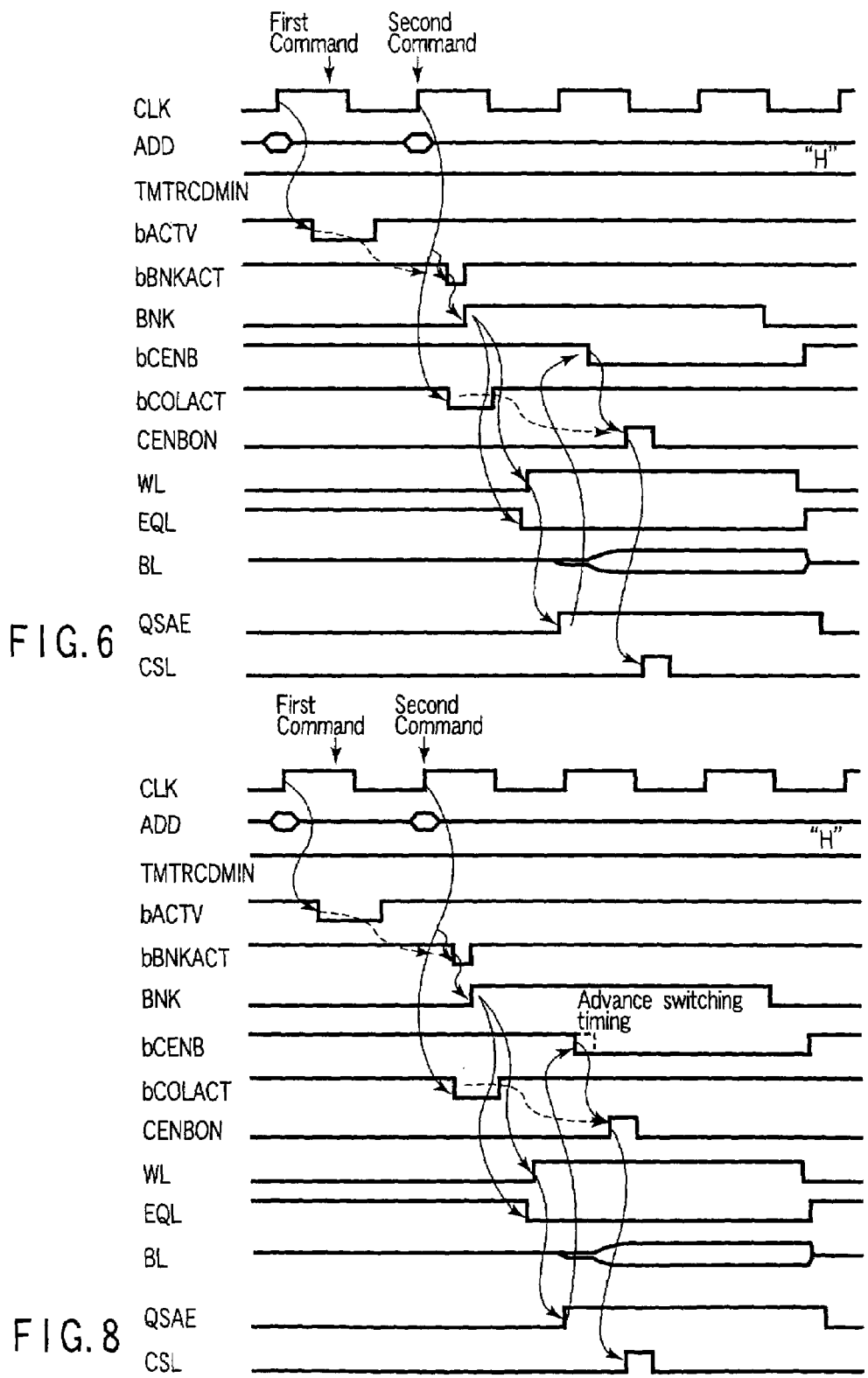
FIG. 6 is an operation waveform diagram for realizing a die sort test in which tRCD is severely limited in an alleviated condition of the clock frequency, for illustrating a test method for the synchronous semiconductor memory device according to the first embodiment of this invention.

FIG. 6 is an operation waveform diagram showing various signals for illustrating the operation of the circuit of FIG. 5.

In the normal operation mode, the signal TMTRCDMIN is set at the "L" level (the signal bTMTRCDMIN is set at the "H" level) and an output signal of the first circuit 11 is selected by the third circuit 13. When the command detection signal bACTV is set to the "L" level in response to the first command, a control signal (an activation signal of a corresponding bank) of the row-system circuit is set to the "H" level in response to the above signal. At this time, the word line WL is activated, the sense amplifier is set into the operative state and a column gating release signal bCENB is set to the "L" level.

In the first embodiment, when the signal TMTRCDMIN is set to the "H" level (the signal bTMTRCDMIN is set to the "L" level) to make an entry into the test mode as shown in FIG. 6, an output signal bACTVD of the second circuit 12 is selected by the third circuit 13. Thus, a series of operations of the row-system circuit is started at the same timing as input timing of the second command. As a result, the potential of the column selection line CSL can be controlled to be changed to the "H" level after the column gating release signal bCENB is set to the "L" level.

Specifically, in the circuit shown in FIG. 5, the command detection signal bACTV is shifted (delayed) by one cycle and a bank activation signal bBNKACT is set to the "L" level by use of a pulse-like signal bACTVD. By the above control operation, as shown in the operation waveform diagram of FIG. 6, the control operation for changing the control signal (activation signal of a corresponding bank) BNK of the row-system circuit to the "H" level in the same cycle as the second command can be performed.

Thus, a severe condition of tRCD in which the column selection line CSL is activated in response to the "L" level of the column gating release signal bCENB can be realized by an alleviated condition of the clock frequency in the die sort test.

Therefore, with the above configuration and method, when an entry is made into the test mode such as the die sort test in which the clock cycle time tCK is long, start timing of the operation of the row-system circuit can be delayed in the synchronous semiconductor memory device and set (synchronized) at the same timing as input timing of the second command. As a result, time tRCD from the first command is input to start the operation of the row-system circuit until the second command is input to start the operation of the column-system circuit is reduced and a screening test for the memory core can be made in the severe condition.

[Second Embodiment]

In the first embodiment, it is assumed that activation of the column selection line CSL is controlled according to the input timing of the second command. However, the actual activation timing of the column selection line CSL is controlled in many cases in a cycle one clock or half clock after the second command is input in combination with the other control operation of the column-system circuit. At this time, the die sort test will be made in the alleviated condition of the time tRCD even when the first embodiment is applied.

Therefore, in the second embodiment, the bank activation signal bBNKACT is further delayed with respect to input of the second command by one clock or half clock so that the die sort test can be realized in a condition in which tRCD is severely limited in the above condition.

Figure 7:
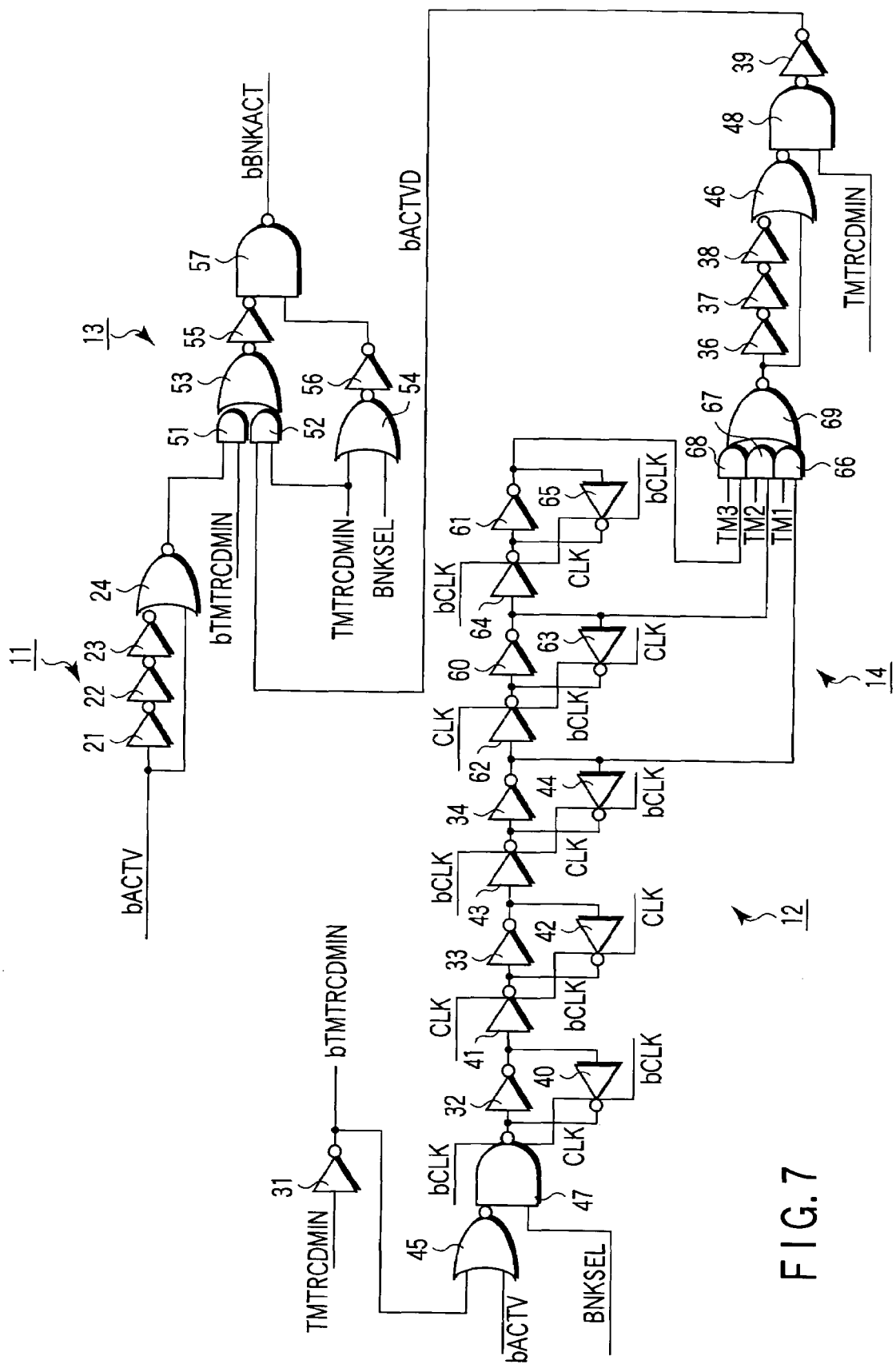
FIG. 7 is a circuit diagram showing an example of the configuration of an extracted circuit used to realize an operation for changing start timing of the operation of a row-system circuit in synchronism with activation timing of a column selection line, for illustrating a synchronous semiconductor memory device according to a second embodiment of this invention and a test method thereof.

The circuit of FIG. 7 is attained by providing a timing control circuit 14 in the second circuit 12 in the circuit shown in FIG. 5. That is, the timing control circuit 14 is provided instead of the inverter 35 in the circuit of FIG. 5. In FIG. 7, portions which are the same as those of FIG. 5 are denoted by the same reference symbols and the detail explanation thereof is omitted.

The second circuit 12 includes inverters 31 to 39, 60, 61, clocked inverters 40 to 44, 62 to 65, AND gates 66, 67, 68, NOR gates 45, 46, 69 and NAND gates 47, 48. An operation mode specifying signal TMTRCDMIN is supplied to the input terminal of the inverter 31 and an output signal bTMTRCDMIN of the inverter 31 is supplied to one input terminal of the NOR gate 45. A command detection signal bACTV is supplied to the other input terminal of the NOR gate 45. The output terminal of the NOR gate 45 is connected to one input terminal of the NAND gate 47. The NAND gate 47 is operated in synchronism with clock signals bCLK, CLK and a bank selection signal BNKSEL is supplied to the other input terminal thereof. The output terminal of the NAND gate 47 is connected to the input terminal of the inverter 32. The output terminal of the inverter 32 is connected to the input terminal of the clocked inverter 40 which is operated in synchronism with the clock signals CLK, bCLK and the output terminal of the clocked inverter 40 is connected to the input terminal of the inverter 32. The output terminal of the inverter 32 is connected to the input terminal of the clocked inverter 41 which is operated in synchronism with the clock signals CLK, bCLK. The output terminal of the clocked inverter 41 is connected to the input terminal of the inverter 33. The output terminal of the inverter 33 is connected to the input terminal of the clocked inverter 42 which is operated in synchronism with the clock signals bCLK, CLK and the output terminal thereof is connected to the input terminal of the inverter 33. The output terminal of the inverter 33 is connected to the input terminal of the clocked inverter 43 which is operated in synchronism with the clock signals bCLK, CLK. The output terminal of the clocked inverter 43 is connected to the input terminal of the inverter 34. The output terminal of the inverter 34 is connected to the input terminal of the clocked inverter 44 which is operated in synchronism with the clock signals CLK, bCLK and the output terminal thereof is connected to the input terminal of the inverter 34. Further, the output terminal of the inverter 34 is connected to the input terminal of the clocked inverter 62 which is operated in synchronism with the clock signals CLK, bCLK and the output terminal thereof is connected to the input terminal of the inverter 60. The output terminal of the inverter 60 is connected to the input terminal of the clocked inverter 63 which is operated in synchronism with the clock signals bCLK, CLK and the output terminal thereof is connected to the input terminal of the inverter 60. The output terminal of the inverter 60 is connected to the input terminal of the clocked inverter 64 which is operated in synchronism with the clock signals bCLK, CLK. The output terminal of the clocked inverter 64 is connected to the input terminal of the inverter 61. The output terminal of the inverter 61 is connected to the input terminal of the clocked inverter 65 which is operated in synchronism with the clock signals bCLK, CLK and the output terminal thereof is connected to the input terminal of the inverter 61.

Output signals of the inverter 34 and inverters 60, 61 are respectively supplied to one-side input terminals of the AND gates 66, 67, 68. Timing control signals TM1, TM2, TM3 are respectively supplied to the other input terminals of the AND gates 66, 67, 68. The output terminals of the AND gates 66, 67, 68 are respectively connected to first to third input terminals of the NOR gate 69. The timing control signals TM1, TM2, TM3 are signals used to select delay amounts of the start timing of the operation of the row-system circuit. When the timing control signal TM1 is set to the "H" level, the start timing of the operation of the row-system circuit is delayed so as to be set at the same timing as input timing of the second command. When the timing control signal TM2 is set to the "H" level, the start timing of the operation of the row-system circuit is delayed with respect to input timing of the second command by half clock. When the timing control signal TM3 is set to the "H" level, the start timing of the operation of the row-system circuit is delayed with respect to input timing of the second command by one clock.

Further, the output terminal of the NOR gate 69 is connected to the input terminal of the inverter 36 and one input terminal of the NOR gate 46. The output terminal of the inverter 36 is connected to the input terminal of the inverter 37, the output terminal of the inverter 37 is connected to the input terminal of the inverter 38, and the output terminal of the inverter 38 is connected to the other input terminal of the NOR gate 46. The output terminal of the NOR gate 46 is connected to one input terminal of the NAND gate 48 and a signal TMTRCDMIN is supplied to the other input terminal thereof. The output terminal of the NAND gate 48 is connected to the input terminal of the inverter 39 and a second signal bACTVD is output from the inverter 39.

With the above configuration, the control operation is performed not only at the same timing as input timing of the second command, but also at different timings by additionally providing the timing control circuit 14. That is, the die sort test can be made in a severe condition of tRCD by selectively switching timing at which the signal BNK is switched to the "H" level in synchronism with activation timing of the column selection line CSL by use of the timing control signals TM1, TM2, TM3 even if the control operation is performed to activate the column selection line CSL one clock or half clock after the second command is input.

Therefore, according to the configuration and method described above, if activation timing of the column selection line CSL is controlled in a cycle one clock or half clock after the second command is input in combination with the other control operation of the column-system circuit, start timing of the operation of the row-system circuit is synchronized with the clock cycle time in which the column selection line is activated and the die sort test can be made in a severe condition of tRCD. Further, by providing the timing selection circuit 14, start timing of the operation of the row-system circuit can be freely set based on the timing control signals TM1, TM2, TM3 and the die sort test can be made in a severe condition of tRCD as required.

[Third Embodiment]

The die sort test can be made in a severe condition of tRCD by applying the control operation of the first or second embodiment, but in a third embodiment, the screening test can be made in a severer condition of tRCD.

FIG. 8 is an operation waveform diagram for illustrating a synchronous semiconductor memory device according to the third embodiment of this invention and a test method thereof. As is clearly understood from FIG. 8, activation timing of a column-system circuit is advanced by setting the switching timing of a column gating release signal bCENB earlier than in a usual case (advancing the activation timing) in the test mode in the first or second embodiment. As a result, the condition of tRCD becomes severer and the screening test of tRCD having a guard band can be realized in an alleviated condition of the clock frequency in the die sort test or the like.

In the first to third embodiments, a case wherein the FCRAM is used as an example is explained, but this invention can be applied to another semiconductor memory device. For example, this invention can be preferably applied to a memory in which a period of time from row activation to column activation is shorter than the clock cycle. Further, if the operation speed of the semiconductor memory device is enhanced to make one cycle time shorter in future, this invention can be applied to a memory in which one cycle time is short.

As described above, according to one aspect of this invention, a synchronous semiconductor memory device in which the screening test can be made in a severe condition of tRCD even in a long clock cycle and a test method thereof can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A synchronous semiconductor memory device in which an operation of a row-system circuit is started in response to input of a first command and an operation of a column-system circuit is started in response to input of a second command, comprising:
    a first circuit configured to generate a first signal for a normal operation mode based on a command detection signal which is activated in response to the first command,
    a second circuit configured to receive the command detection signal, an operation mode specifying signal which selectively specifies one of the normal operation mode and test mode and a selection signal used to select at least part of the memory cells in a memory cell array and generate a second signal for a test mode to synchronize start timing of the operation of the row-system circuit with input timing of the second command, and
    a third circuit configured to select the first signal output from the first circuit when the normal operation mode is specified by the operation mode specifying signal, select the second signal output from the second circuit when the test mode is specified, and generate a third signal used to activate at least part of the memory cells in the memory cell array based on a selected one of the first and second signals and the selection signal.

2. A synchronous semiconductor memory device according to claim 1, wherein the second command is input in a cycle next to a cycle in which the first command is input.

3. A synchronous semiconductor memory device according to claim 1, wherein the second circuit includes a delay circuit which delays start timing of the operation of the row-system circuit with respect to the second command in one clock unit or half clock unit.

4. A synchronous semiconductor memory device according to claim 1, wherein the selection signal is a signal which selects a bank in the memory cell array and the third signal is a signal which activates the selected bank in the memory cell array.

5. A method for testing a synchronous semiconductor memory device in which an operation of a row-system circuit is started in response to input of a first command and an operation of a column-system circuit is started in response to input of a second command, comprising:
    inputting an operation mode specifying signal which selectively specifies one of a normal operation mode and test mode,
    inputting a first command,
    inputting a second command in a cycle next to a cycle in which the first command is input,
    synchronizing start timing of the operation of the row-system circuit with input timing of the second command when the test mode is specified by the operation mode specifying signal,
    activating at least part of memory cells in a memory cell array, and
    making a screening test with respect to the activated memory cell.

6. A test method for the synchronous semiconductor memory device according to claim 5, wherein the second command is input in a cycle next to a cycle in which the first command is input.

7. A test method for the synchronous semi-conductor memory device according to claim 5 in which the screening test having a guard band is made and which further comprises advancing switching timing of a column gating release signal for row-system control before making the screening test.

* * * * *